United States Patent
Chiu et al.

(10) Patent No.: US 9,229,888 B1
(45) Date of Patent: Jan. 5, 2016

(54) AREA-EFFICIENT DYNAMICALLY-CONFIGURABLE MEMORY CONTROLLER

(75) Inventors: Gordon Raymond Chiu, North York (CA); Joshua David Fender, East York (CA)

(73) Assignee: Altera Corporation, San Jose, CA (US)

( * ) Notice: Subject to any disclaimer, the term of this patent is extended or adjusted under 35 U.S.C. 154(b) by 208 days.

(21) Appl. No.: 13/562,124

(22) Filed: Jul. 30, 2012

(51) Int. Cl.
*G06F 13/16* (2006.01)
*G06F 15/78* (2006.01)
*G06F 17/50* (2006.01)

(52) U.S. Cl.
CPC ........ *G06F 13/1668* (2013.01); *G06F 15/7867* (2013.01); *G06F 17/5054* (2013.01)

(58) Field of Classification Search
CPC . G06F 2212/50; G06F 13/1668; G06F 13/16; G06F 13/1694; G06F 17/5045; G06F 17/5054; G06F 15/7867; G06F 15/7871; G06F 15/7882; G06F 15/7885
See application file for complete search history.

(56) References Cited

U.S. PATENT DOCUMENTS

| | | | |
|---|---|---|---|
| 6,828,822 B1 * | 12/2004 | Bellis et al. | 326/38 |
| 8,099,564 B1 * | 1/2012 | Kulkarni et al. | 711/154 |
| 2004/0117566 A1 * | 6/2004 | McClannahan et al. | 711/154 |
| 2004/0133758 A1 * | 7/2004 | Matsuda | 711/167 |
| 2005/0180206 A1 * | 8/2005 | Randell et al. | 365/185.01 |
| 2010/0005365 A1 * | 1/2010 | Buchmann et al. | 714/758 |

\* cited by examiner

*Primary Examiner* — Michael Krofcheck
(74) *Attorney, Agent, or Firm* — Weaver Austin Villeneuve & Sampson LLP

(57) ABSTRACT

Architecture, systems, and methods for developing, an area-efficient dynamically-configurable memory controller are described. The architecture, systems and methods may provide savings in terms of surface area required for implementing a dynamically configurable hardened memory controller or controllers.

15 Claims, 11 Drawing Sheets

AREA-EFFICIENT DYNAMICALLY-CONFIGURABLE MEMORY CONTROLLER

FIELD OF THE INVENTION

The present disclosure generally relates to the field of dynamically-configurable memory controllers.

BACKGROUND

A memory controller provides user logic with read and write access to data stored in a memory device. For example, user logic may send a user command to the memory controller. The memory controller may convert the user command into one or more memory controller commands. The one or more memory controller commands may be sent to the memory to read or write the data.

A memory controller may be implemented on a Programmable Logic Device (PLD) as well as other kinds of devices implemented on integrated circuits. Where a memory controller is implemented using the basic building block logic elements generally provided on a PLD, the memory controller is commonly referred to as a soft memory controller.

In contrast, to facilitate a user's implementation of a memory controller, a PLD may be designed to contain a specialized block of circuitry dedicated to implementing a memory controller. Such circuitry may be described as a memory controller block, and replaces the usual circuitry that would appear in that section of the PLD. A memory controller implemented using such specialized circuitry (i.e., a memory controller block) is commonly referred to as a hardened memory controller. With a hardened memory controller, to implement a memory controller in the field, a user requests a memory controller in the course of programming the PLD, and a memory controller is instantiated in the memory controller block at compile time.

SUMMARY OF THE INVENTION

In some implementations, a hardened memory controller may not allow a user the flexibility to configure different kinds of memory controllers. Providing a user flexibility to determine the characteristics of a memory controller is desirable. Therefore, it would be desirable to provide a dynamically configurable hardened memory controller.

An architecture, systems, and techniques for developing, an area-efficient dynamically-configurable memory controller are described. According to an embodiment of the present disclosure, a dynamically configurable memory controller block is provided that is configurable to operate as a first kind of memory controller or a second kind of memory controller, or to operate as two memory controllers—for example, the first kind of memory controller and the second kind of memory controller—simultaneously.

According to an embodiment of the present disclosure, a dynamically configurable memory controller block is provided that is configurable to operate as a half rate memory controller or a full rate memory controller, for example, where the memory controller block includes a first set of memory controller resources to be used by the half rate memory controller implementation, a second set of memory controller resources to be used by the full rate memory controller implementation, and a third set of memory controller resources to be used by both the half rate and full rate memory controller implementations.

According to an embodiment of the present disclosure, a dynamically configurable memory controller block is provided that is configurable to operate as a first memory controller having a first data bus width or a second memory controller having a second data bus width, where the memory controller block includes a first set of memory controller resources to be used by the first data bus width memory controller implementation, a second set of memory controller resources to be used by the second data bus width memory controller implementation, and a third set of memory controller resources to be used by both the first data bus width and second data bus width memory controller implementations.

BRIEF DESCRIPTION OF THE DRAWINGS

An architecture, systems, and techniques for developing, an area-efficient dynamically-configurable memory controller, together with other features, embodiments, and advantages of the present disclosure, may best be understood by reference to the following description taken in conjunction with the accompanying drawings, which illustrate various embodiments of the present systems and methods. In the drawings, structural elements having the same or similar functions are denoted by like reference numerals.

DETAILED DESCRIPTION

Figure 1:
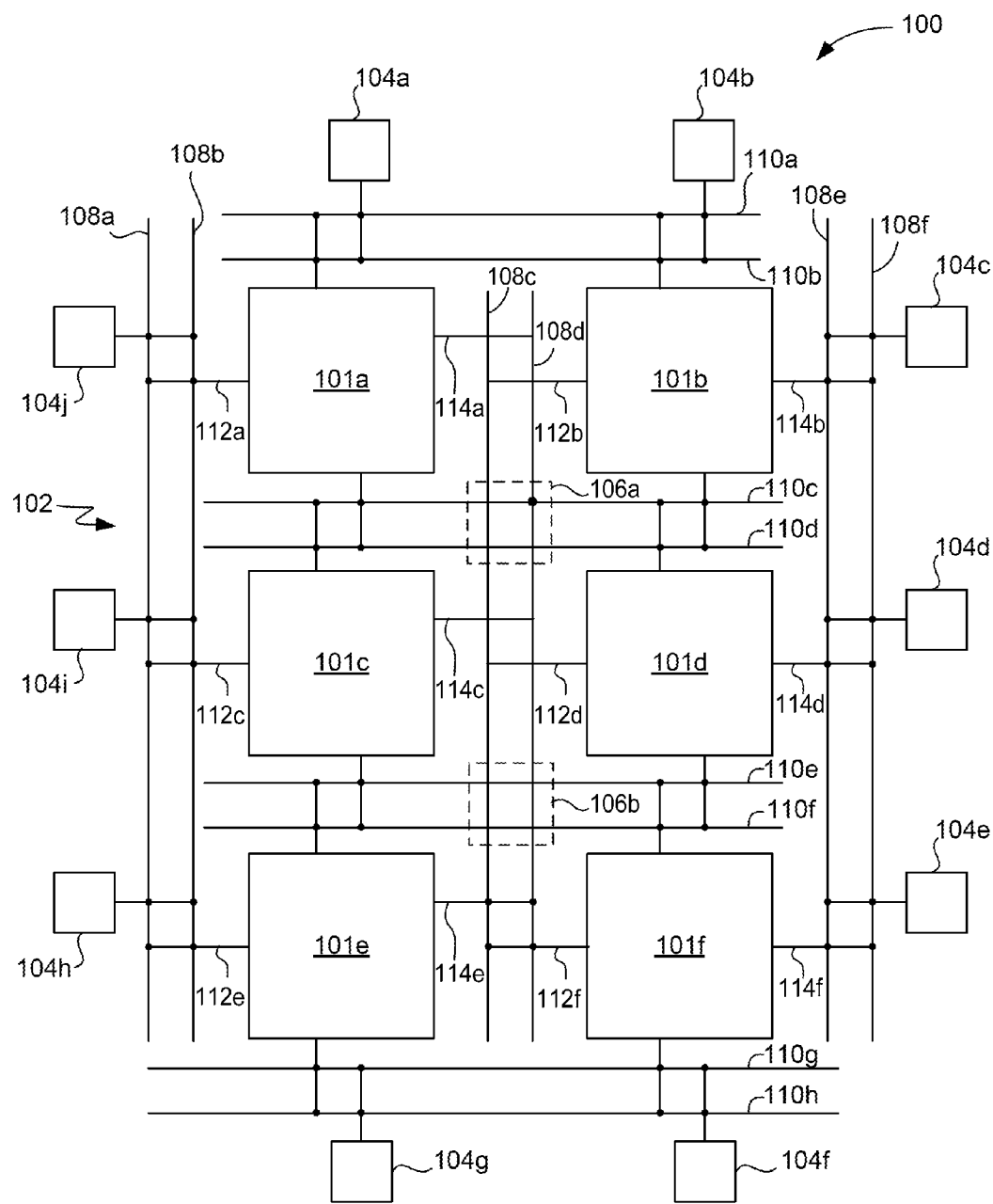
FIG. 1 is an exemplary block diagram of a programmable logic device (PLD) in accordance with one embodiment of the present invention.

Various embodiments of the present disclosure provide techniques and mechanisms for providing an area-efficient dynamically configurable memory controller on an integrated circuit. The techniques and mechanisms of the present disclosure can be applied to non-programmable devices such as Application Specific Integrated Circuits (ASICs) and Application Specific Standard Products (ASSPs), as well as Programmable Logic Devices (PLDs) and other programmable devices. The below-described embodiments are not meant to limit the scope of the present disclosure. On the contrary, the disclosure is intended to cover alternatives, modifications, and equivalents as may be included within the spirit and scope of the disclosure.

As noted above, according to an embodiment of the present disclosure, a dynamically configurable memory controller block is provided that is configurable to operate as a first kind of memory controller or a second kind of memory controller, or to operate as two memory controllers—for example, the first kind of memory controller and the second kind of memory controller—simultaneously.

According to an embodiment of the present disclosure, such a memory controller block may be implemented on a Programmable Logic Device (PLD). A PLD can comprise a plurality of logic array blocks containing logic elements (LEs), look up tables (LUTs), and other elements, which a user may use as building blocks to implement desired features. For example, referring to FIG. 1, a programmable logic device (PLD) 100 may be a field programmable gate array (FPGA). In various embodiments, PLD 100 may include multiple logic array blocks 101 (LABs), a routing architecture 102, multiple input/output (IO) pads 104, and switches 106. It is appreciated that one or more of the LABs 101 and switches 106 may be configured using configuration data. LABs 101 may be coupled to each other via the routing architecture 102 and/or one or more switches 106. The routing architecture 102 may include multiple vertical LAB lines 108 and multiple horizontal LAB lines 110. LABs 101 may have one or more LAB inputs 112 and one or more LAB outputs 114. LABs 101 may also have, in the vertical direction, one or more LAB inputs 116 and one or more LAB outputs 118. {It is noted the signals may also go in the opposite direction with the items designated 112 and 116 representing LAB outputs, and the items designated 114 and 118 representing LAB inputs.) IO pads 104 may be coupled to the routing architecture 102.

In one embodiment, LAB 101a may receive an input signal from I0 pad 104j through the LAB input 112a. In some embodiments, the LAB 101b may receive an input signal from another LAB, e.g., LAB 101a via LAB input 112b. It is appreciated that LAB 101b may output the received signal via LAB output 114b to the I0 pad 104c. The I0 pad 104c may send the output signal to an off-chip device (not shown). In certain embodiments, the off-chip device may be located on a chip separate from a chip on which PLD 100 may be located.

Although six LABs 101 are shown in FIG. 1, it is noted that in various embodiments, PLD 100 may include a different number of LABs 101. Moreover, although ten I0 pads 104 are shown in FIG. 1, in some embodiments, a different number of IO pads 104 may be used.

Figure 2:
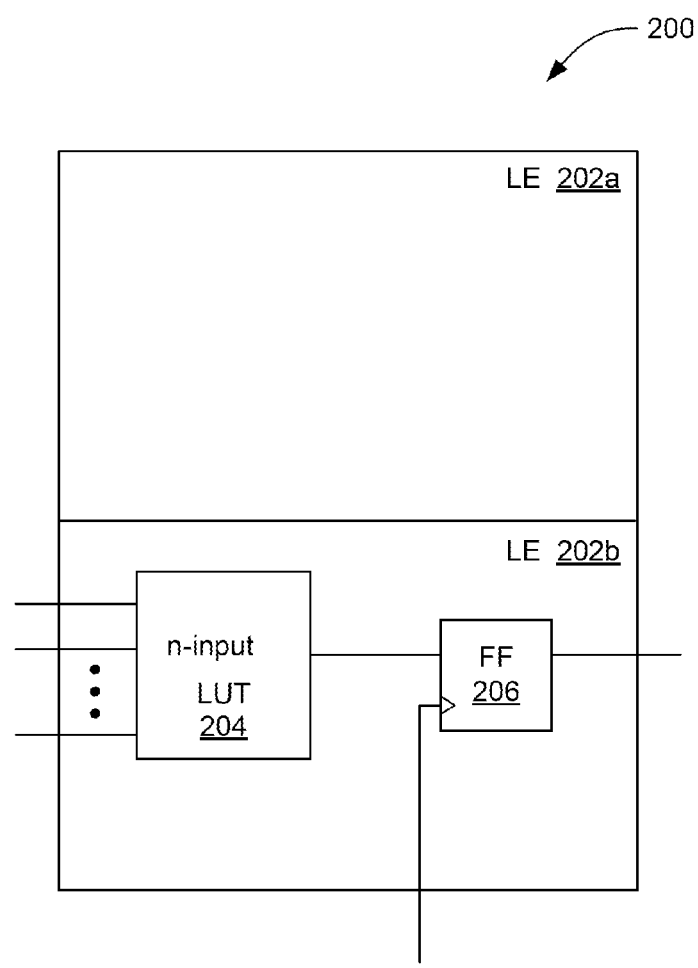
FIG. 2 is an exemplary logic array block (LAB) of a PLD in accordance with one embodiment of the present invention.

As shown in FIG. 2, a LAB 200 may be an example of any of LABs 101 (FIG. 1). In some embodiments, LAB 200 may include one or more logic elements 202 (LEs). LE 202b may include an n-input look-up table 204 (LUT) where n is an integer greater than zero. LE 202b may further include a flip-flop 206, such as a D flip-flop or a JK flip-flop. Flip-flop 206 may receive a clock signal from a global clock tree (not shown) of PLD 100 (FIG. 1).

The n-input LUT 204 may include one or more multiplexers that output one or more of input signals received. Flip-flop 206 may receive a signal from n-input LUT 204 and output the signal based on the clock signal.

In various embodiments, LE 202b may not include flip-flop 206. In certain embodiments, LE 202b may include a different number of flip-flops and different number of n-input LUTs than that shown in FIG. 2. In some embodiments, LAB 200 may include a different number of LEs 202 than that shown in FIG. 2.

Figure 3:
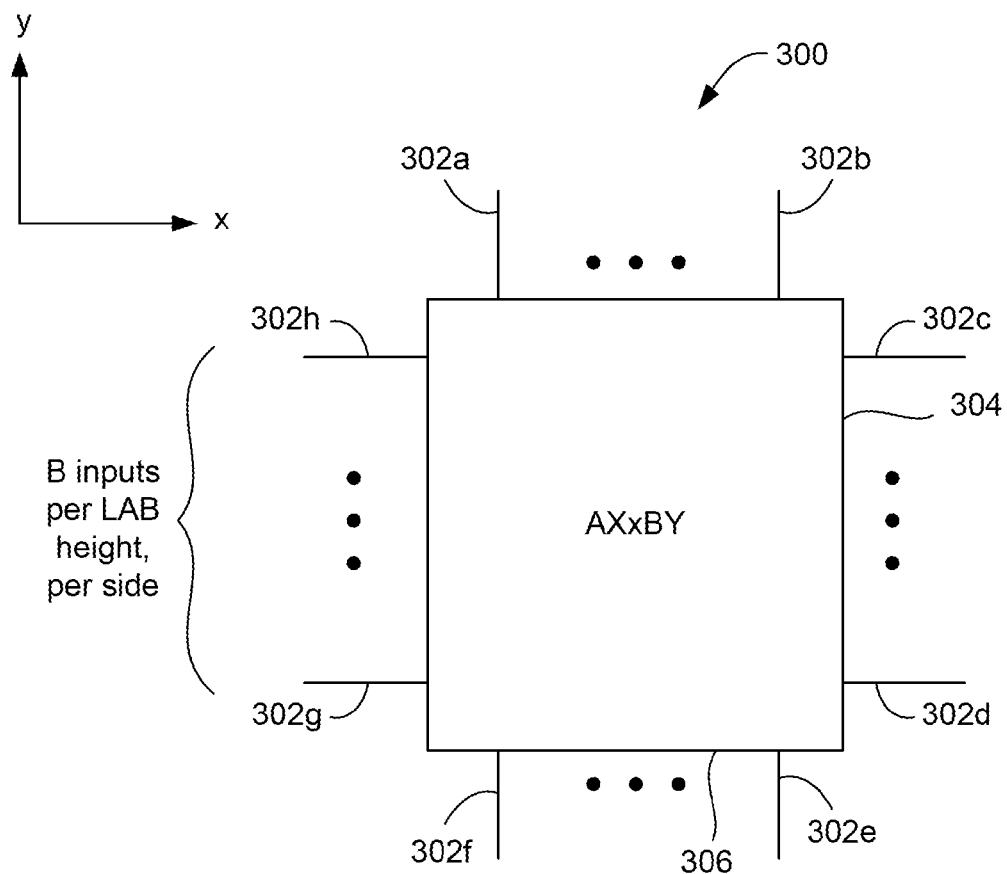
FIG. 3 is an exemplary logic block of a PLD in accordance with one embodiment of the present invention.

As noted above, a user may program a configuration of LUTs, flip flops and other elements of a PLD to implement a memory controller—this is commonly referred to as a soft memory controller. In some circumstances, however, it is preferable to include hardwired memory controller functionality on a PLD 100. Such memory controllers are referred to as hardened memory controllers. They are hardened in the sense that specialized dedicated logic is built on the PLD to implement a memory controller. For example, as shown in FIG. 3, in some embodiments, a memory controller block 300 may be used to replace one or more LABs 101 of PLD 100 (FIG. 1). In other embodiments, a memory controller block may replace other blocks other than LABs, including I/Os, on-chip memory, or other elements. In some embodiments, the block 300 may span multiple rows and/or multiple columns within PLD 100 (FIG. 1). In a variety of embodiments, block 300 may have multiple connections 302, some of which may be input connections and some of which may be output connections. Memory controller block 300 may have a dimension of AX×BY where B is a number of connections 302 along a y-direction of block 300 and A is a number of connections 302 along an x-direction of block 300. Y is a unit height of block 300 measured in the y-direction and X is a unit width of block 300 measured in the x-direction, the units reflecting the amount of space required for a connection interface. The dimension AX×BY of block 300 may occupy a surface area of AX×BY on a substrate of the chip on which PLD 100 (FIG. 1) may be implemented.

The surface area AX×BY may be based on multiple factors including a gate area of logic gates within block 300 and a routing density of routing architecture 102 (FIG. 1). As an example, an edge 304 of memory controller block 300 may have a height that accommodates 16 connections 302 in the y-direction and an edge 306 of memory controller block 300 may have a width that accommodates six connections 302 in the x-direction.

A memory device and user logic (which provides user read and write commands, for example) may not operate with the same frequency. If a memory device and user logic operate at the same frequency, a memory controller may operate at what is commonly referred to as "full rate", that is, it may receive data from the user logic at the same rate that it sends data to the memory, and vice versa. However, frequently this is not possible because the speed at which the memory device operates (and can accept or send data) is, for example, often faster than the speed of user logic. In such a situation, a user might desire to configure a memory controller that runs at "half rate". In a half rate memory controller, the memory controller may receive data from user logic at half the speed the memory controller sends data to the memory device. In such a situation, to compensate for the slower speed of the user logic, in some embodiments, the memory controller may accept data from user logic at twice the data bus width it sends data to the memory device—thus equalizing the amount of data it can receive from the user logic and send to the memory device in a given clock cycle. It will be understood that the ratio between the operating frequency of user logic and a memory device can vary. The discussion of half rate and full rate in this disclosure should not be taken as limiting the invention, they are simply illustrative examples.

Since the ratio of user logic and memory device speeds can vary, providing a memory controller configurable to operate at a first data rate ratio (for example, full rate) as well as a second rate ratio (for example, half rate) is desirable. To address this challenge, in some solutions, two separate memory controllers can be included in a memory controller block, one operating at half rate and the other operating at full rate, the two memory controllers coupled to a multiplexer which can be used to select between the half rate and full rate memory controller. Thus, a user can choose between the two memory controllers in the field. However, providing two separate memory controllers, only one of which operates at a time, may not be an area efficient solution. Various embodiments of the present disclosure provide additional architectures, systems and techniques for a reconfigurable hardened memory controllers, as described below.

Hybrid Memory Controller

Figure 4:
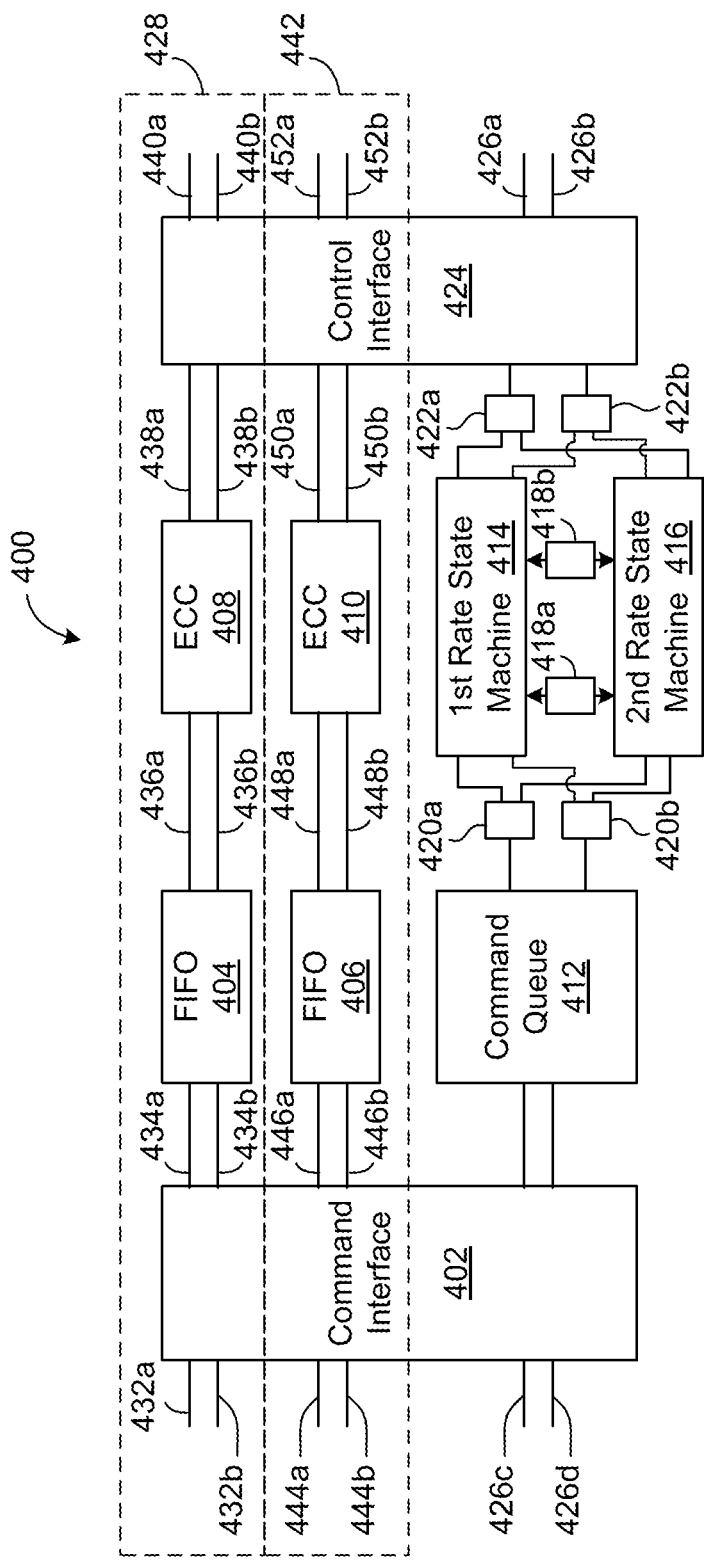
FIG. 4 is an exemplary hybrid memory controller of a PLD in accordance with one embodiment of the present invention.

With reference to FIG. 4, a hybrid memory controller 400 may be implemented within memory controller block 300 (FIG. 3). Hybrid memory controller 400 provides a memory controller configurable to operate at either one of two data rate ratios—for example, half rate or full rate. Configuration of the data rate ratio of the hybrid memory controller can occur dynamically at runtime, or using configuration RAM bits at a time a user instantiates the memory controller.

Hybrid memory controller 400 achieves area efficiencies by sharing a considerable amount of logic between a first rate ratio memory controller a second rate ratio memory controller. These resources can be dynamically allocated in the field. Memory controller components that can be shared for area reduction include core controller logic and routing interfaces. For example, resources relating to a write data pipeline and to bank tracking may be shared to reduce the total area footprint of hybrid memory controller 400. Referring to FIG. 4 and as discussed further below, such shared resources can include command queue 412, FIFO buffers 404 and 406, error code checker (ECC) 408 and 410, timers 418a and 418 b, bank trackers (not pictured), and/or command interface 402 and control interface 424.

The inventors recognized the footprint of a hardened memory controller block is largely determined by the number of required ports, leaving a significant portion of the logic circuitry of a regular hardened memory controller block unused. In one analysis, it was found that port requirements for a single hardened memory controller was approximately the same as for two multiplexed hardened memory controllers or for a hardened hybrid memory controller capable of operating at either half rate or full rate. In contrast, the placed area of the logic required for two multiplexed memory controllers was almost twice that for a single memory controller, while the placed area of the logic required for a hybrid memory controller was only 1/7 more than that for a single hardened memory controller.

In some embodiments, hybrid memory controller 400 may include a command interface 402, a first first-in-first-out buffer (FIFO) 404, a second FIFO 406, a first error code checker 408 (ECC), a second ECC 410, a command queue 412, a first rate state machine 414, a second rate state machine 416, multiple bank timers 418, multiple state machine input demultiplexers 420, multiple state machine output multiplexers 422, a control interface 424, and multiple connections 426, 432, 440, 444, and 452, which are examples of connections 302 (FIG. 3).

As noted above, much of the area savings of a hybrid memory controller can come from sharing data path resources and bank timer logic. The data path can be split into two data paths (for example, a data path 428 or a data path 442) and one or both data paths can be utilized depending on whether a smaller or larger data bus width is desired. As discussed above, in various embodiments, a data bus width at an interface can inversely correspond to the frequency with which the memory controller receives data at that interface. For example, a half rate memory controller may have twice the data bus width at a user interface (than a full rate memory controller) because the half rate memory controller is receiving data from user logic at half the data rate.

Additionally, among other things, most or all of the bank timers 418 can be re-used in either the first rate ratio or second rate ratio configuration. For example, bank timers 418 may be configured to operate during a first rate ratio operation and the same bank timers 418 may be configured to operate during a second rate ratio operation. As another example, data path 442 may be configured to operate during both a first rate ratio operation and a second rate ratio operation.

The state machines 414 and 416 generally cannot be shared between the two memory controller instances in most embodiments though. First rate state machine 414 may be used when hybrid memory controller 400 is configured to operate at a first rate ratio (for example, full rate) and the second rate state machine 416 may be used when the hybrid memory controller 400 is configured to operate at a second rate ratio (for example, half rate). Note that while full rate and half rate are discussed for illustrative purposes as examples of data rate ratios, other data rate ratios may apply in other embodiments.

An example of the memory device may include a random access memory (RAM) or a read-only memory (ROM). In one embodiment, the memory device may be a static RAM (SRAM), a synchronous dynamic RAM (SDRAM). The SDRAM may be a double data rate (DDR) SDRAM, a DDR2 SDRAM, or a DDR3 SDRAM. In other embodiments, the memory device may include SRAM based devices such as QDRII, QDRIV or RLDRAMII, RLDRAM3.

Regarding the components of hybrid memory controller 400, command interface 402 may include a portion of routing architecture 102 (FIG. 1). Similarly, control interface 424 may include a portion of routing architecture 102 (FIG. 1). Command queue 412 may include a queue of memory cells.

In some embodiments, command queue 412 may receive a user command from a first master controller (not shown) associated with user logic, such as a processor or an Ethernet device, and may store the user command. Examples of the user command include a read command to read data from a memory cell of the memory device, or a write command to write data to the memory cell.

In addition, a first processor, described below, associated with hybrid memory controller 400 may determine whether to transfer an amount of data received from the first master controller to a first slave device at the first data rate ratio or second data rate ratio. For example, the first processor may determine whether to transfer data at the first data rate ratio or the second data rate ratio based on an amount of data and an amount of time to be taken to transfer the data. The first slave device may be the memory device or a processor.

In various embodiments, the determination of whether to implement a first data rate ratio or second data rate ratio for the memory controller may be based on parameters of the first slave device. For example, a rate at which hybrid memory controller 400 receives data from the first master controller associated with user logic cannot exceed a rate of operation of the memory device to which the data is transferred.

It will be understood that, in addition to determining the date rate ratio at run time, as described above, the date rate ratio may also be determined when the circuit is programmed at design-time.

Example of Hybrid Memory Controller Configured to Operate at a First Rate Ratio

A first processor, as described above, associated with hybrid memory controller 400 may determine whether to configure the hybrid memory controller to transfer an amount of data received from the first master controller (located outside the memory controller) to a first slave device at the first data rate ratio or second data rate ratio. (Alternatively, as noted above, in other embodiments, the date rate ratio at which hybrid memory controller 400 operates may be configured at the time the circuit is programmed at design time.) The first processor configures various portions of hybrid memory controller 400 during a first data rate ratio (for example, full rate) operation. In various embodiments, the first data rate ratio state machine 414 and connections 426 may be configured. Moreover, the state machine input demultiplexers 420 may be configured to transfer the user command received within command queue 412 to first rate ratio state machine 414. The first rate ratio state machine 414 sequences multiple user commands for execution. The first rate state machine 414 may convert the user command into one or more memory controller commands, such as a read address strobe, a write address strobe, and bank enable, and may store the memory controller commands. Also, state machine output multiplexers 422 may be configured to transfer one or more memory controller commands from first rate ratio state machine 414 to control interface 424.

Also, a data path 442 may be configured. For example, the first rate state machine 414 may configure the data path 442 to couple second FIFO 406 to the first master controller. The data path 442 may include connections 444, a portion of command interface 402, connections 446, second FIFO 406, connections 448, second ECC 410, connections 450, a portion of control interface 424 coupled to the connections 450, and connections 452. The portion of command interface 402 is coupled to the connections 444 and the portion of control interface 424 is coupled to the connections 450. The data path 442 may be configured to transfer data received from the first master controller to the first slave device. Second ECC 410 may receive data from second FIFO 406 and may perform error code checking on the data. The data is then transferred from the second ECC 410 to control interface 424. Data may thereafter be transferred from control interface 424 to a memory bank of the first slave device.

Moreover, in some embodiments, the first processor may be restricted from configuring a data path 428. The data path may include connections 432, a portion of command interface 402, connections 434, FIFO 404, connections 436, ECC 408, connections 438, a portion of control interface 424, and connections 440. The portion of command interface 402 is coupled to the connections 432 and the portion of control interface 424 is coupled to the connections 438. Also, the first processor may be restricted from configuring second rate ratio state machine 416.

Moreover, all bank timers 418 may be configured. Bank timers 418 may count the amount of time between subsequent memory commands sent to the same memory bank. Such memory commands may include precharge, active, read, or write commands. Bank timers may be used to ensure that enough time elapses between memory commands to adhere to memory protocol requirements. Bank timer 418a may also send a signal to a bank tracker (not shown) of hybrid memory controller 400. The bank tracker may also be configured. Upon receiving a signal from bank timer 418a, the bank tracker may store an identification of the memory bank to which data has been written, to track the memory bank.

Furthermore, one or more state machine output multiplexers 422 and connections 426 may be configured to provide the memory controller commands from the first rate ratio state machine 414 to the first slave device.

Additionally, it is noted that in various embodiments, during the first rate ratio operation, hybrid memory controller 400 may have the same configuration during the transfer of data from the first slave device to the first master controller as that during the transfer of data from the first master controller to the first slave device. A transfer of data from the first slave device to the first master controller may be performed, for example, during a read operation.

It is also noted that in various embodiments, during the first rate operation, data path 428 may be configured instead of data path 442.

Example of Hybrid Memory Controller Configured to Operate at Second Rate Ratio

In various embodiments, upon determining to transfer data at the second rate ratio (for example, full rate), the first processor may configure hybrid memory controller 400 to operate at the second rate ratio. The first processor, as described above, is associated with hybrid memory controller 400 and may determine whether to configure the hybrid memory controller to transfer an amount of data received from the first master controller (located outside the memory controller) to a first slave device at the first data rate ratio or second data rate ratio. The second rate ratio state machine 416 may be configured. In some embodiments, the first processor may be restricted from configuring the first rate ratio state machine 414. Moreover, the state machine input demultiplexers 420 may be configured to transfer the user command received within command queue 412 to second rate state ratio machine 416. Also, both of datapaths 428 and 442 may be configured. For example, the second rate ratio state machine 416 may configure the data path 428 to couple first FIFO 404 to the first master controller and may configure the data path 442 to also couple second FIFO 406 to the first master controller. Furthermore, select inputs of state machine output multiplexers 422 may be configured to provide signals received from second rate ratio state machine 416.

The second rate ratio state machine 416 may convert a user command into one or more memory controller commands and may store the one or more memory controller commands. Furthermore, the state machine output multiplexers 422 may be configured to transfer the one or more memory controller commands from second rate ratio state machine 416 to control interface 424. All bank timers 418 may be configured to operate.

The first ECC 408 may receive data from first FIFO 404 and may perform error code checking on the data. The data is then transferred from the first ECC 408 to control interface 424. Moreover, the second ECC 410 may receive data from second FIFO 406 and may perform error code checking on the data. The data is then transferred from the second ECC 410 to control interface 424.

Data may thereafter be transferred from control interface 424 to a memory bank of the first slave device.

The bank timers 418a may count an amount of time between subsequent memory commands sent to the same memory bank as described above, and the bank tracker of hybrid memory controller 400 may perform a similar operation as that described above.

Furthermore, it is noted that in various embodiments, data may be transferred from the first slave device to the first master controller via a same configuration of hybrid memory controller 400 as that during the transfer of data from the first memory controller to the first slave device.

It is further noted that the first processor, as used herein, may be a processor of hybrid memory controller 400. In various embodiments, the first processor may be a processor outside hybrid memory controller 400. In multiple embodiments, hybrid memory controller 400 may include any number of ECCs, FIFOs, and state machines depending on the number and/or ratios of the data rate ratio options provided by the hybrid memory controller.

Dual Memory Controller

In another embodiment, a dual memory controller 500 may be provided on an integrated circuit. The dual memory controller may be configured as a single memory controller or as a two memory controllers, i.e., a first memory controller and a second memory controller. In the two memory controller configuration, the first memory controller may process data received from a first user logic and the second memory controller may process data received from a second user logic (the first and second user logic sometimes referred to as a first and second master controller below). Various resources are shared between the first memory controller and the second memory controller to save surface area on the integrated circuit. These resources may be dynamically allocated. Each of the first and second memory controllers are configurable to operate at either one of two data rate ratios—for example, half rate or full rate. Configuration of the data rate ratio of the memory controllers can occur dynamically at runtime, or using configuration RAM bits at a time a user instantiates the memory controller. Moreover, the dual memory controller may be configured as either a single memory controller or as two memory controllers, at a time a user instantiates one of the memory controllers supported by the integrated circuit, or dynamically at run-time. That is, reconfiguration in the field can happen both when users themselves program a PLD with their design, as well as when users create designs that may dynamically change the memory controller configuration on the fly during run-time.

It is noted that dual memory controller 500 may achieve area efficiencies through similar resource sharing and dynamic resource allocation techniques to those that apply to hybrid memory controller 400 in that dual memory controller 500 provides that different memory controllers may share a considerable portion of the resources of the dual memory controller 500. The difference is that dual memory controller 500 can contain additional logic components and resources such that an option to operate dual memory controller 500 as two memory controllers which can operate simultaneously is provided.

Figure 5:
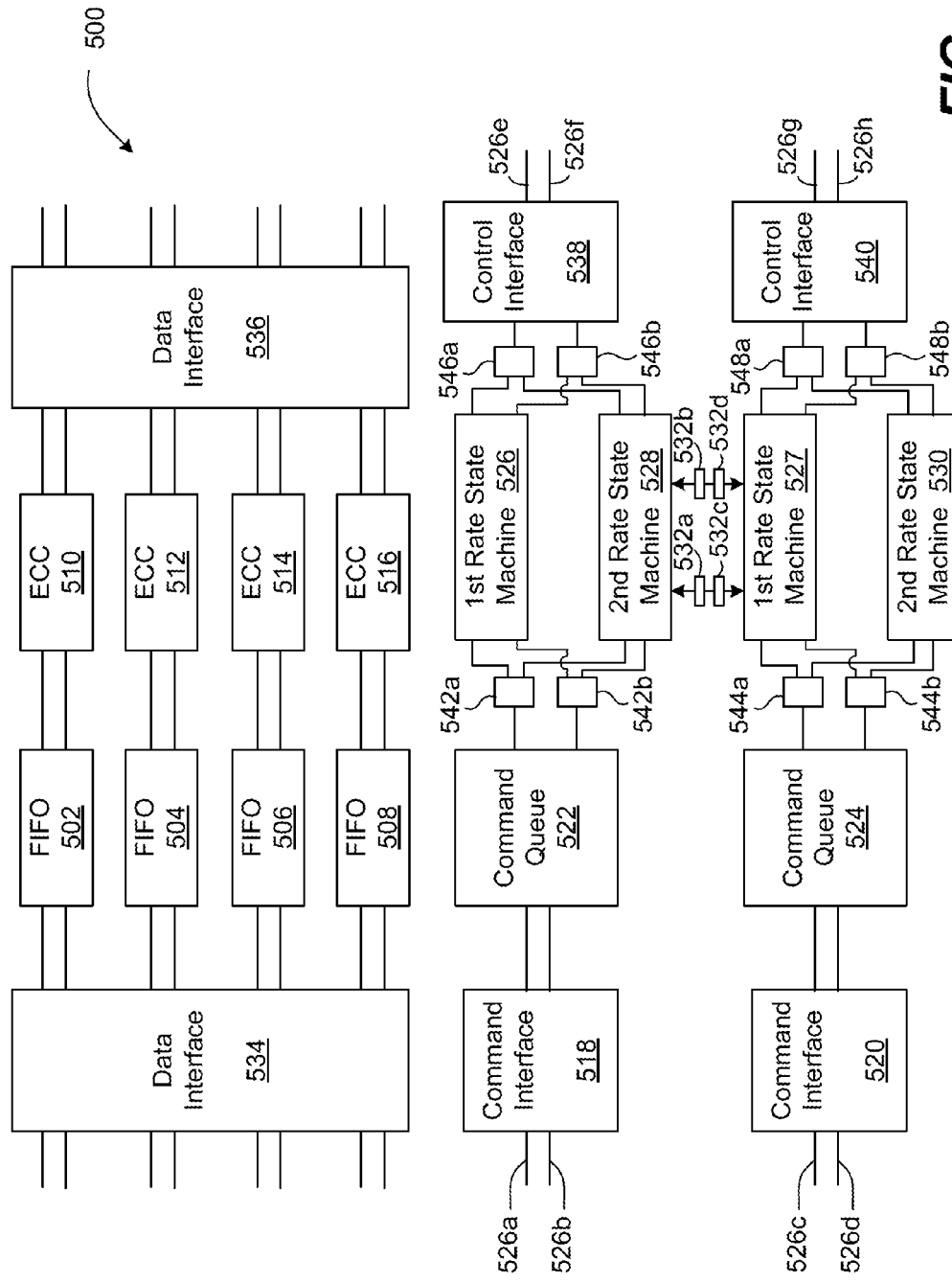
FIG. 5 is an exemplary dual memory controller of a PLD in accordance with one embodiment of the present invention.

With reference to FIG. 5, a dual memory controller 500 may be implemented within memory controller block 300 (FIG. 3). In various embodiments, dual memory controller 500 may include a third FIFO 502, a fourth FIFO 504, a fifth FIFO 506, and a sixth FIFO 508, a third ECC 510, a fourth ECC 512, a fifth ECC 514, and a sixth ECC 516, multiple command interfaces 518 and 520, multiple command queues 522 and 524, multiple first rate state machines 526 and 527, multiple second rate state machines 528 and 530, multiple bank timers 532, multiple data interfaces 534 and 536, multiple control interfaces 538 and 540, multiple state machine input demultiplexers 542, multiple state machine input demultiplexers 544, multiple state machine output multiplexers 546, and multiple state machine output multiplexers 548. Command Interfaces 518, 520, 538, and 540 are associated with connections 526. It is noted that, among other things, the dual memory controller 500 has two additional data paths, two more state machines, an additional command queue, an additional command interface, and an additional control interface, as well as an extra bank timer array, than hybrid memory controller 400.

In some embodiments, a data width of third FIFO 502 or fourth FIFO 504 is half of a data width of first FIFO 404 (FIG. 4). For example, if a data width of first FIFO 404 is 128 bits, a data width of each of third FIFO 502 and fourth FIFO 504 is 64 bits. As yet another example, if a data width of first FIFO 404 is 64 bits, a data width of each of third FIFO 502 and fourth FIFO 504 is 32 bits. Moreover, a data width of fifth FIFO 506 or sixth FIFO 508 may be half of a data width of second FIFO 406 (FIG. 4).

Similarly, a data width of each of third ECC 510 and fourth ECC 512 may be half of a data width of first ECC 408 (FIG. 4). Moreover, a data width of each of fifth ECC 514 and sixth ECC 516 may be half of a data width of second ECC 410 (FIG. 4).

A number of bank timers 532 within dual memory controller 500 may be twice the number of bank timers 418 (FIG. 4).

It is noted that in some embodiments, data interfaces 534 and 536 lack any multiplexers. Rather, a portion of routing architecture 102 (FIG. 1) may be implemented in each data interface 534 and 536. For example, the data interfaces 534 and 536 may be restricted from being configured as one or more multiplexers by a second processor (the term second processor is used here to distinguish from the first processer described in connection with the hybrid memory controller described above). The second processor is described below.

Each command interface 518 and 520 may include a portion of routing architecture 102 (FIG. 1). Moreover, each control interface 538 and 540 may include a portion of routing architecture 102 (FIG. 1).

In some embodiments, the second processor (not shown) may determine whether one or more user commands are received from the first master controller (not shown) or multiple user commands are received from the first master controller and a second master controller (not shown). Upon determining that multiple user commands are received from both the first and second master controllers, the second processor may operate dual memory controller 500 as two memory controllers. On the other hand, upon determining that one or more user commands are received from the first master controller, the second processor may configure dual memory controller 500 to operate as a single memory controller. This is an example of the dual memory controller being dynamically configurable at run-time.

Figure 6:
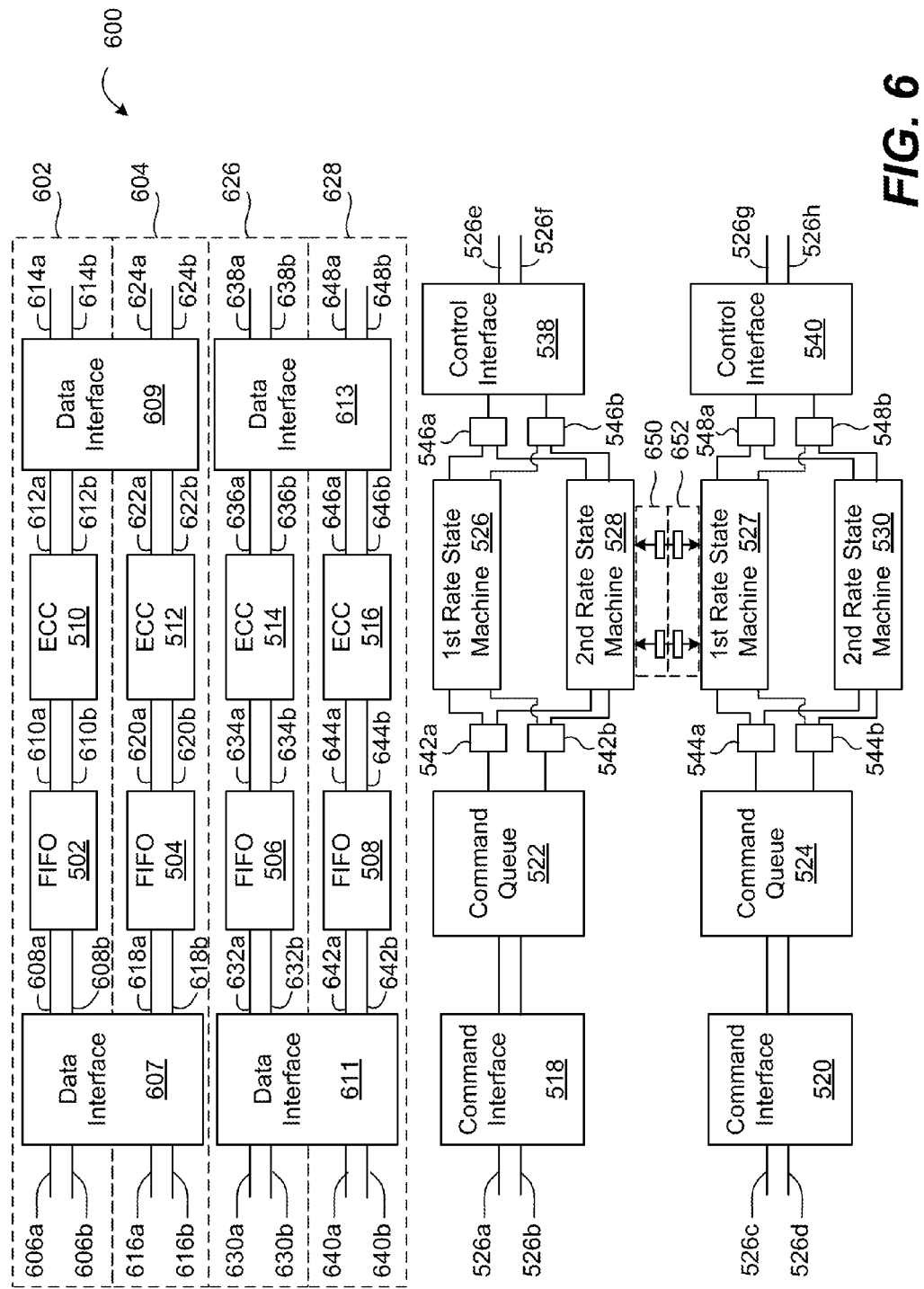
FIG. 6 is an exemplary first configuration of a dual memory controller in accordance with one embodiment of the present invention.

Example of Dual Memory Controller Configured as Two Memory Controllers Each Operating at a First Data Rate Ratio As noted above, the dual memory controller 500 (FIG. 5) may be configured to operate as one or two memory controllers. Referring to FIG. 6, a dual memory controller 600 may be configured, for example, to operate as two memory controllers each operating at a first data rate ratio (for example, full rate). The dual memory controller 600 is configured in this manner by the second processor in response to user specifications in the field or to run-time conditions, depending on how a user configures the dual memory controller 600.

In various embodiments, both first rate ratio (for example, full rate) state machines 526 and 527 may be configured, and two data paths may be assigned to each master controller. Further the bank timers 532 may be dynamically allocated between the first master controller and the second master controller. For example, the first rate state machines 526 and 527 may be configured. The first rate state machine 526, which may be associated with the first memory controller, may configure a data path 602 to couple third FIFO 502 to the first master controller and may configure a data path 604 to couple fourth FIFO 504 to the first master controller. The data path 602 may include connections 606, a portion of a data interface 607, connections 608, FIFO 502, connections 610, ECC 510, connections 612, a portion of data interface 609, and connections 614. The portion of data interface 607 is coupled to the connections 606 and the portion of data interface 609 is coupled to connections 612. Moreover, data path 604 may include connections 616, a portion of data interface 607, connections 618, FIFO 504, connections 620, ECC 512, connections 622, a portion of data interface 609, and connections 624. The portion of data interface 607 is coupled to the connections 616 and the portion of data interface 609 is coupled to connections 622.

Moreover, in some embodiments, the first rate state machine 527 of the second memory controller may configure a data path 626 to couple fifth FIFO 506 to the second master controller. Also, the first rate state machine 527 may configure a data path 628 to couple sixth FIFO 508 (note that 508 is the fourth FIFO in FIG. 6 but the sixth FIFO of the Figures, since two FIFOs are also pictured in FIG. 5) to the second master controller. It is noted that each data path 602, 604, 626, and 628 may be configured by configuring one or more switches 106, one or more vertical LAB lines 108, and/or one or more horizontal LAB lines 110 (FIG. 1).

Data path 626 may include connections 630, a portion of a data interface 611, connections 632, FIFO 506, connections 634, ECC 514, connections 636, a portion of data interface 613, and connections 638. The portion of data interface 611 is coupled to the connections 630 and the portion of data interface 613 is coupled to the connections 636. Moreover, data path 628 may include connections 640, a portion of data interface 611, connections 642, FIFO 508, connections 644, ECC 516, connections 646, a portion of data interface 613, and connections 648. The portion of data interface 611 is coupled to the connections 640 and the portion of data interface 613 is coupled to the connections 646.

Moreover, in some embodiments, the second processor may configure data interface 534 (FIG. 5) as data interfaces 607 and 611. The data interfaces 607 and 611 may be configured to prevent switching of data between the data interfaces 607 and 611. Similarly, the data interface 536 (FIG. 5) may be configured as data interfaces 609 and 613. Moreover, the data interfaces 609 and 613 may be configured to prevent switching of data between the data interfaces 609 and 613.

In various embodiments, command queue 522 may receive one or more user commands via command interface 518 from the first master controller and command queue 524 may receive one or more user commands via command interface 520 from the second master controller. Furthermore, the select inputs of the state machine input demultiplexers 542 may be configured to output the one or more user commands stored within command queue 522 to first data rate ratio state machine 526 of the first memory controller (of the dual memory controller). Also, the select inputs of the state machine input demultiplexers 544 may be configured to output the one or more user commands stored within command queue 524 to first data rate ratio state machine 527 of the second memory controller (of the dual memory controller).

Moreover, when the user command stored within first rate state machine 526 is a write command, third and fourth FIFOs 502 and 504 may receive data via data interface 607 from the first master controller to write to the first slave device. Third ECC 510 may perform error code checking on the data received from third FIFO 502 and provides the data to data interface 609. Fourth ECC 512 may perform error code checking on data received from fourth FIFO 504 and provides the data to data interface 609.

Also, when the user command stored within first rate state machine 527 is a write command, fifth and sixth FIFOs 506 and 508 may receive data via data interface 611 from the second master controller to write to the first slave device and/or a second slave device (not shown). The data is written to the first and/or second slave device via the data interface 613. Fifth ECC 514 may perform error code checking on data received from fifth FIFO 506 and may provide the data to data interface 613. Sixth ECC 516 may perform error code checking on data received from sixth FIFO 508 and may provide the data to data interface 613.

Moreover, in some embodiments, first data rate ratio state machine 526 may generate one or more memory controller commands from the user command received from the first master controller, and may store the one or more memory controller commands. Also, select inputs of the state machine output multiplexers 546 may be configured to provide signals received from first rate state machine 526, and select inputs of the state machine output multiplexers 548 may be configured to provide signals received from first data rate ratio state machine 527. State machine output multiplexers 546 may provide the one or more memory controller commands received from first data rate ratio state machine 526 to control interface 538. The control interface 538 may send the one or more memory controller commands to the first and/or second slave device.

Furthermore, in various embodiments, first data rate ratio state machine 527 may generate one or more memory controller commands from a user command received from the second master controller, and may store the one or more memory controller commands. Second set of state machine output multiplexers 548 may provide the one or more memory controller commands received from first data rate ratio state machine 527 to control interface 540. The control interface 540 may send the one or more memory controller commands to the first and/or second slave device.

Additionally, in some embodiments, a first portion 650, such as half, of bank timers 532a and 532b (FIG. 5) may be allocated to the first master controller (associated with the first memory controller) and the remaining portion 652 of bank timers 532c and 532d may be allocated to the second master controller (associated with the second memory controller). Bank timer 532a (FIG. 5) may start counting an amount of time between subsequent memory commands sent to a first memory bank of the first or second slave device and bank timer 532c may start counting an amount of time between subsequent memory commands sent to a second memory bank of the first or second slave device.

Bank timer 532a or 532c also may send a signal to a bank tracker (not shown) of dual memory controller 600. Upon receiving a signal from any of bank timers 532, the bank tracker may store an identification of the memory bank to track the memory bank.

It is noted that during execution of the one or more user commands received from the first and second master controllers to read data from the first and/or second slave devices at a first data rate ratio, dual memory controller 600 may have the same configuration as that during the dual first data rate ratio operation to write data to the first and/or second slave devices.

It is further noted that in some embodiments, the second processor may be a processor of dual memory controller 600. In various embodiments, the second processor may be located outside dual memory controller 600. It is also noted that in one embodiment, the first master controller may access any number of slave devices via data paths 602 and 604. Moreover, in various embodiments, the second master controller may access any number of slave devices via data paths 626 and 628.

It is further noted that in some embodiments, including the one described above, implementation of two memory controllers within memory controller block 300 (FIG. 3) may occur. The two memory controllers may be a part of dual memory controller 600. A first one of the two memory controllers may be used by the first master controller and a second one of the two memory controllers may be used by the second master controller. The first memory controller of dual memory controller 600 may include data paths 602 and 604, command interface 518, command queue 522, state machine input demultiplexers 542, first rate state machine 526, second rate state machine 528, state machine output multiplexers 546, control interface 538, and first portion 650. The second memory controller may include data paths 626 and 628, command interface 520, command queue 524, state machine input demultiplexers 544, first rate state machine 527, second rate state machine 530, state machine output multiplexers 548, control interface 540, and remaining portion 652.

Although in the above embodiment two memory controllers are configured from dual memory controller 600, in other embodiments, only a single memory controller may be implemented from dual memory controller 600. Additionally, when two memory controllers are implemented, they need not be implemented to each operate at the same data rate ratio. The example described above merely shows this case for illustrative purposes. Each of the two memory controllers (of the dual memory controller) may have two state machines, each state machine capable of supporting a different data rate ratio (for example, half rate or full rate). Thus, in some embodiments, a first memory controller may operate at a first data rate ratio (for example, full rate), and a second memory controller may operate at a second data rate ratio (for example, half rate). The two memory controllers may share the four dath paths 602, 604, 606, and 608, and the data paths may be allocated between the memory controillers as is convenient.

Figure 7:
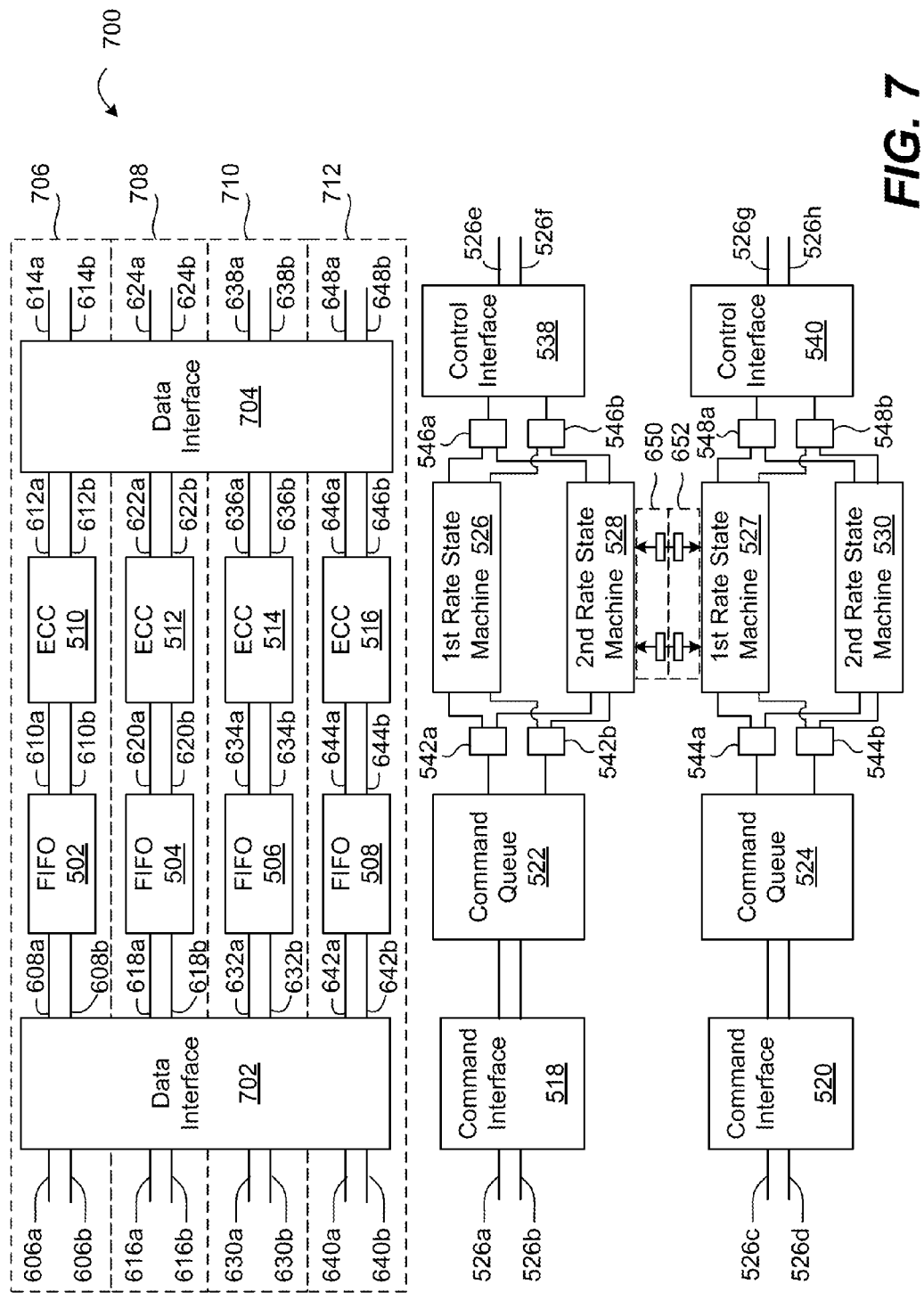
FIG. 7 is an exemplary second configuration of a dual memory controller in accordance with one embodiment of the present invention.

Example of Dual Memory Controller Configured as a Single Memory Controller Operating at a Second Data Rate Ratio As shown in FIG. 7, dual memory controller 500 (FIG. 5) may be configured as a single memory controller. FIG. 7 shows one embodiment of such a configuration. In such a configuration the second rate state machine 530, state machine input demultiplexers 544, and state machine output multiplexers 548 may be configured to allocate FIFOs 502, 504, 506, and 508, and ECCs 510, 512, 514, and 516 to be used by the first master controller. That is, all four data paths may be allocated to one user logic, and only one state machine may need to be instantiated. Moreover, the command interface 520, control interface 540, a data interface 702, a data interface 704, command queue 524, and all bank timers 532 are configured. Also, select inputs of state machine input demultiplexers 544 may be configured to provide one or more user commands received from command queue 524 to second rate state machine 530. The select inputs of state machine output multiplexers 548 may also be configured to provide one or more memory controller commands received from second rate state machine 530 to control interface 540. Additionally, it is noted that in some embodiments, the second processor may be restricted from configuring command interface 518, command queue 522, first rate state machines 526 and 527, second rate state machine 528, state machine input demultiplexers 542, state machine output multiplexers 546, and control interface 538.

Moreover, all data paths 706, 708, 710, and 712 may be configured for use by the first master controller. For example, the second processor may configure second rate state machine 530. The second rate state machine 530 may then configure data paths 706, 708, 710, and 712 for use by the first master controller. In this example, second rate state machine 530 may configure data paths 706, 708, 710, and 712 to couple FIFOs 502, 504, 506, and 508 via one or more switches 106, one or more vertical LAB lines 108, and/or one or more horizontal LAB lines 110 (FIG. 1) with the first master controller.

Data path 706 may include connections 606, a portion of data interface 702, connections 608, FIFO 502, connections 610, ECC 510, connections 612, a portion of data interface 704, and connections 614. The portion of data interface 702 may be coupled to the connections 606. Moreover, the portion of data interface 704 may be coupled to the connections 612. Data path 708 may include connections 616, a portion of data interface 702, connections 618, FIFO 504, connections 620, ECC 512, connections 622, a portion of data interface 704, and connections 624. The connections 616 may be coupled to the portion of data interface 702 and the connections 622 may be coupled to the portion of data interface 704.

Moreover, data path 710 may include connections 630, a portion of data interface 702, connections 632, FIFO 506, connections 634, ECC 514, connections 636, a portion of data interface 704, and connections 638. The portion of data interface 702 is coupled to the connections 630 and the portion of data interface 704 is coupled to the connections 636. Furthermore, data path 712 may include connections 640, a portion of data interface 702, connections 642, FIFO 508, connections 644, ECC 516, connections 646, a portion of data interface 704, and connections 646. The portion of data interface 702 is coupled to the connections 640 and the portion of data interface 704 is coupled to the connections 646. All bank timers 532 may be configured for use by the first master controller.

The command queue 524 may receive one or more user commands via command interface 520 from the first master controller. State machine input demultiplexers 544 may transfer the one or more user commands from command queue 524 to second rate state machine 530. Second rate state machine 530 may sequence the one or more user commands received by command queue 524, may convert a user command into one or more memory controller commands, and may store the one or more memory controller commands. State machine output multiplexers 548 may provide the one or more memory controller commands to control interface 540 and the controller interface 540 may send the one or more memory controller commands to the first and/or second slave device.

Moreover, all FIFOs 502, 504, 506, and 508 may receive data via data interface 702 from the first master controller. Third ECC 510 may perform error code checking on data received from third FIFO 502, fourth ECC 512 may perform error code checking on data received from fourth FIFO 504, fifth ECC 514 may perform error code checking on data received from fifth FIFO 506, and sixth ECC 516 may perform error code checking on data received from sixth FIFO 508. Data output from all ECCs 510, 512, 514, and 516 may be received by the first slave device and/or second slave device via data interface 704. Upon issuance of a memory controller command by dual memory controller 700 to execute a user command, bank timer 532b (FIG. 5) may start counting a time between that command a nd a subsequently issued memory command sent to the same memory bank. The memory commands may include precharge, active, read, or write commands. The bank timers 532 may be used to ensure that enough time elapses between memory commands to adhere to memory protocol requirements.

Similarly, if the user command received from the first master controller is a read command, dual memory controller 700 may be configured to operate at the dual second data rate ratio to execute the user command.

It is noted that the dual second data rate ratio operation may include implementation of a single memory controller within memory controller block 300. The single memory controller may be a portion of dual memory controller 700 and may be used by the first master controller. The single memory controller may include data paths 706, 708, 710, and 712, command interface 520, command queue 524, state machine input demultiplexers 544, second rate state machine 530, state machine input multiplexers 548, control interface 540, and bank timers 532 (FIG. 5).

Figure 8:
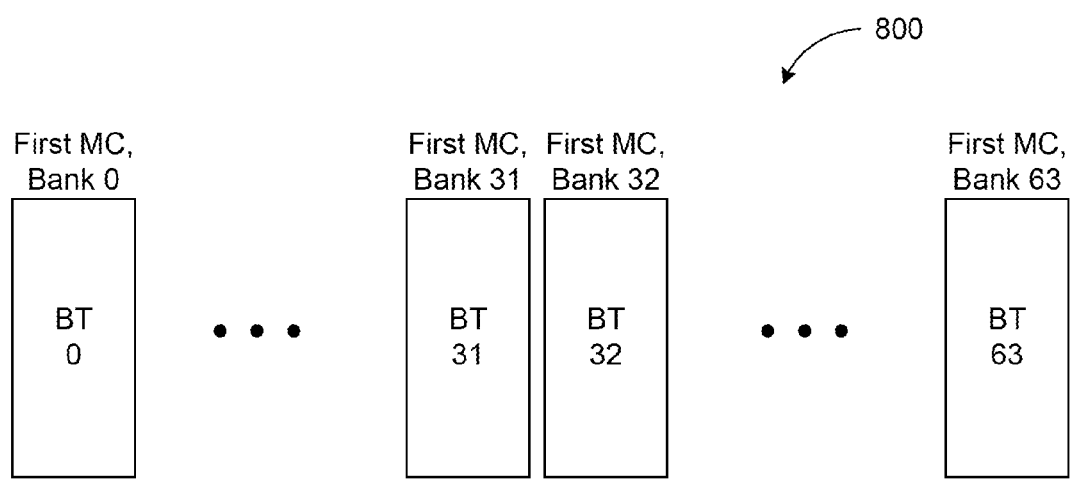
FIG. 8 are exemplary bank timers within a dual memory controller in accordance with one embodiment of the present invention.

Referring to FIG. 8, in various embodiments, a system 800 may include multiple bank timers (BT) 0-63. There are sixty-four bank timers 0-63. One of bank timers 0-63 may be an example of one of bank timers 532 (FIGS. 5-7). During the dual first data rate ratio operation, in some embodiments, bank timers 0-31 may be configured by the second processor to be used to execute a user command received from the first master controller (MC). For example, bank timer 0 may count an amount of time taken to read data from or write data to a memory bank (MB) 0 of the first slave device to execute a user command issued by the first master controller. Moreover, in this example, the bank timer 31 may count an amount of time taken to read data from or write data to a memory bank 31 of the first slave device to execute a user command issued by the first master controller.

Moreover, during the dual first data rate ratio operation, the bank timers 32-63 may be allocated to be used to execute user commands received from the second master controller. As an example, bank timer 32 may count an amount of time between subsequent memory commands sent to a memory bank 32 of the first slave device. Also, in this example, the bank timer 63 may count an amount of time between subsequent memory commands sent to a memory bank 63 of the first slave device. It is noted that there may be sixty-four memory banks and the number of banks matches the number of bank timers 0-63.

Furthermore, it is noted that in various embodiments, during the dual second data rate ratio operation, all the bank timers 0-63 may be configured by the second processor to be used to execute a user command received from the first master controller. Moreover, in some embodiments, one or more of bank timers 0-63 may be restricted from being configured for use by both the first and second master controllers. Rather, in these embodiments, one or more of bank timers 0-63 may be configured for use by the first or second master controller. It is noted that although sixty-four bank timers are shown in FIG. 8, system 800, in various embodiments, system 800 may include any number of bank timers.

Figure 9:
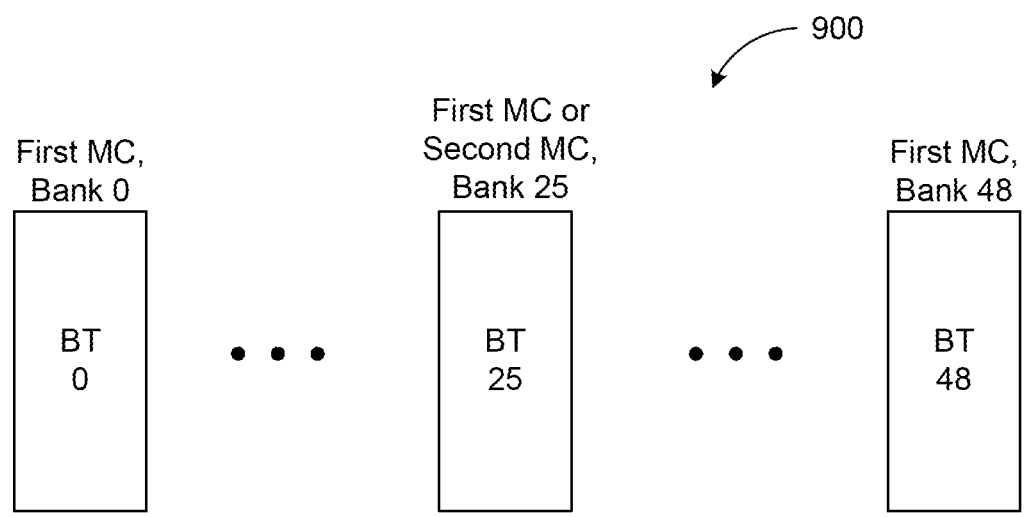
FIG. 9 is an exemplary bank timers within a dual memory controller in accordance with one embodiment of the present invention

With reference to FIG. 9, a system 900 may include multiple bank timers 0-48. There are forty-nine bank timers 0-48. One of bank timers 0-48 may be an example of one of bank timers 532 (FIGS. 5-7). The number of bank timers 0-48 is less than the number of bank timers 0-63 (FIG. 8). The bank timers 0-48 may occupy a lesser surface area on memory controller block 300 (FIG. 3) than that occupied by bank timers 0-63 (FIG. 8).

One or more of bank timers 0-48 may be configured by the second processor to be used by the first and second master controllers. For example, during the dual first data rate ratio operation, when an amount of data to be written to twenty-six memory banks of the first slave device is received by dual memory controller 500 (FIG. 5) from the first master controller and an amount of data to be written to twenty-four memory banks of the first slave device is received by dual memory controller 500 from the second master controller, the second processor may configure the bank timers 0-25 for use by the first master controller and configure the bank timers 25-48 for use by the second master controller. It is noted that although forty-nine bank timers are shown in FIG. 9, in various embodiments, system 900 may include a different number of bank timers.

Figure 10:
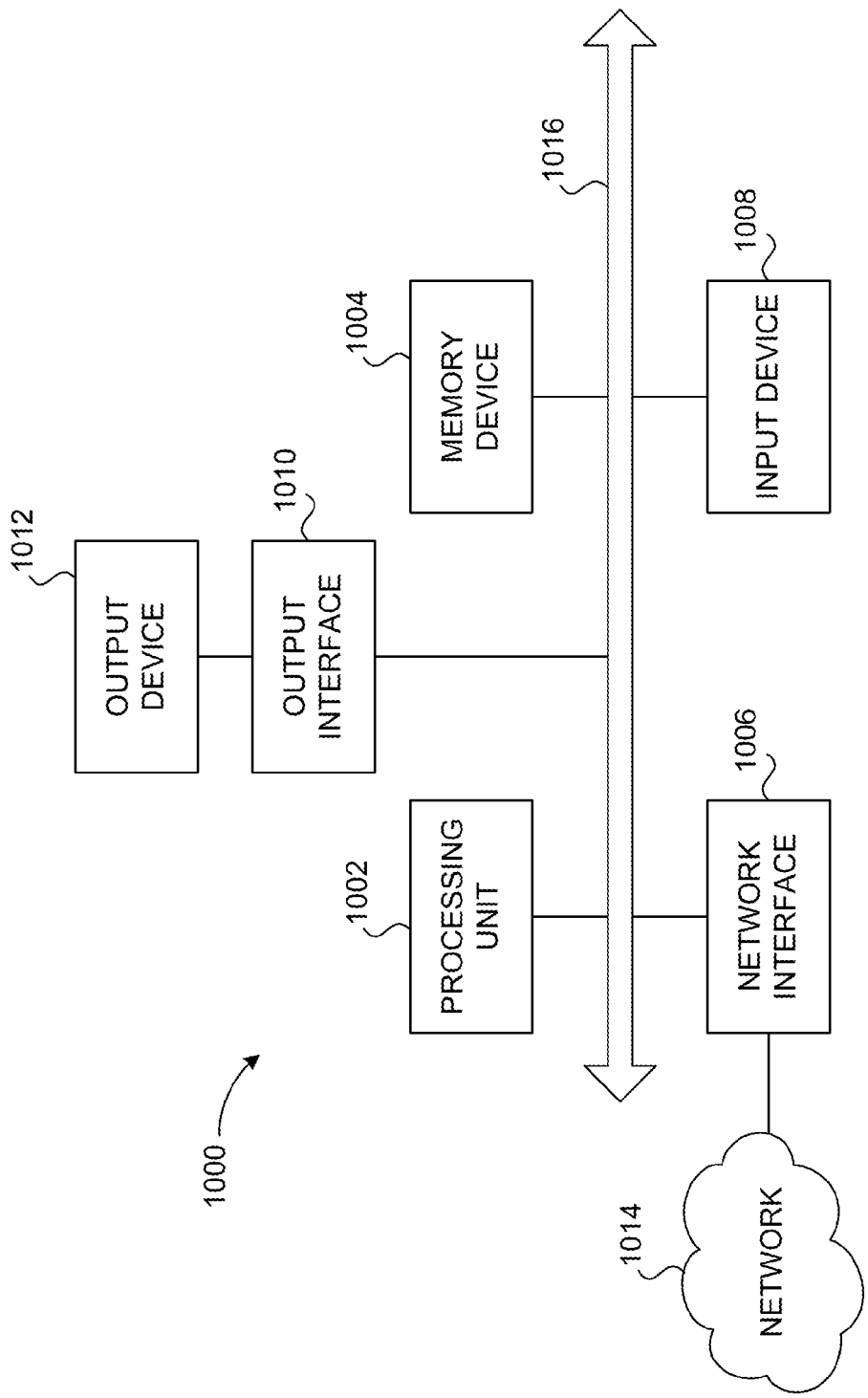
FIG. 10 is an exemplary block diagram of a computer system for designing and initiating a PLD in accordance with one embodiment of the present invention.

Referring to FIG. 10, a computer system 1000 for designing and configuring the PLD 100 (FIG. 1) is described. In certain embodiments, the computer system 1000 may include a processing unit 1002, a memory device 1004, a network interface 1006, an input device 1008, an output interface 1010, and an output device 1012. Processing unit 1002 may be an example of the first processor or the second processor.

Processing unit 1002 may be a central processing unit (CPU), a microprocessor, a floating point coprocessor, a graphics coprocessor, a hardware controller, a microcontroller, a programmable logic device programmed for use as a controller, a network controller, or other processing unit. Memory device 1004 may be a RAM, a ROM, or a combination of RAM and ROM. For example, the memory device 1004 may include a computer-readable medium, such as a floppy disk, a ZIP™ disk, a magnetic disk, a hard disk, a compact disc-ROM (CD-ROM), a recordable CD, a digital video disc (DVD), or a flash memory. Memory device 1004 may store a program code for developing an area-efficient dynamically-configurable memory controller and/or for designing PLD 100.

In various embodiments, network interface 1006 may be a modem or a network interface card (NIC) that allows processing unit 1002 to communicate with a network 1014, such as a wide area network (WAN) or a local area network (LAN). Processing unit 1002 may be connected via a wireless connection or a wired connection to network 1014. Examples of the wireless connection include a connection using Wi-Fi protocol or a WiMax protocol. The Wi-Fi protocol may be an IEEE 802.11, IEEE 802.11a, IEEE 802.11b, IEEE 802.11g, or IEEE 802.11i protocol. Examples of input device 1008 include a mouse, a keyboard, a stylus, or a keypad. Output device 1012 may be a liquid crystal display (LCD) device, a plasma display device, a light emitting diode (LED) display device, or a cathode ray tube (CRT) display device. Examples of output interface 1010 may include a video controller that drives output device 1012 to display one or more images based on instructions received from processing unit 1002. In certain embodiments, processing unit 1002 may access the program code from memory device 1004 or from a remote memory device (not shown), and executes the program code. The remote memory device may be accessed via network 1014. Processing unit 1002, memory device 1004, network interface 1006, input device 1008, output interface 1010, and output device 1012 may communicate with each other via a communication bus 1016.

Figure 11:
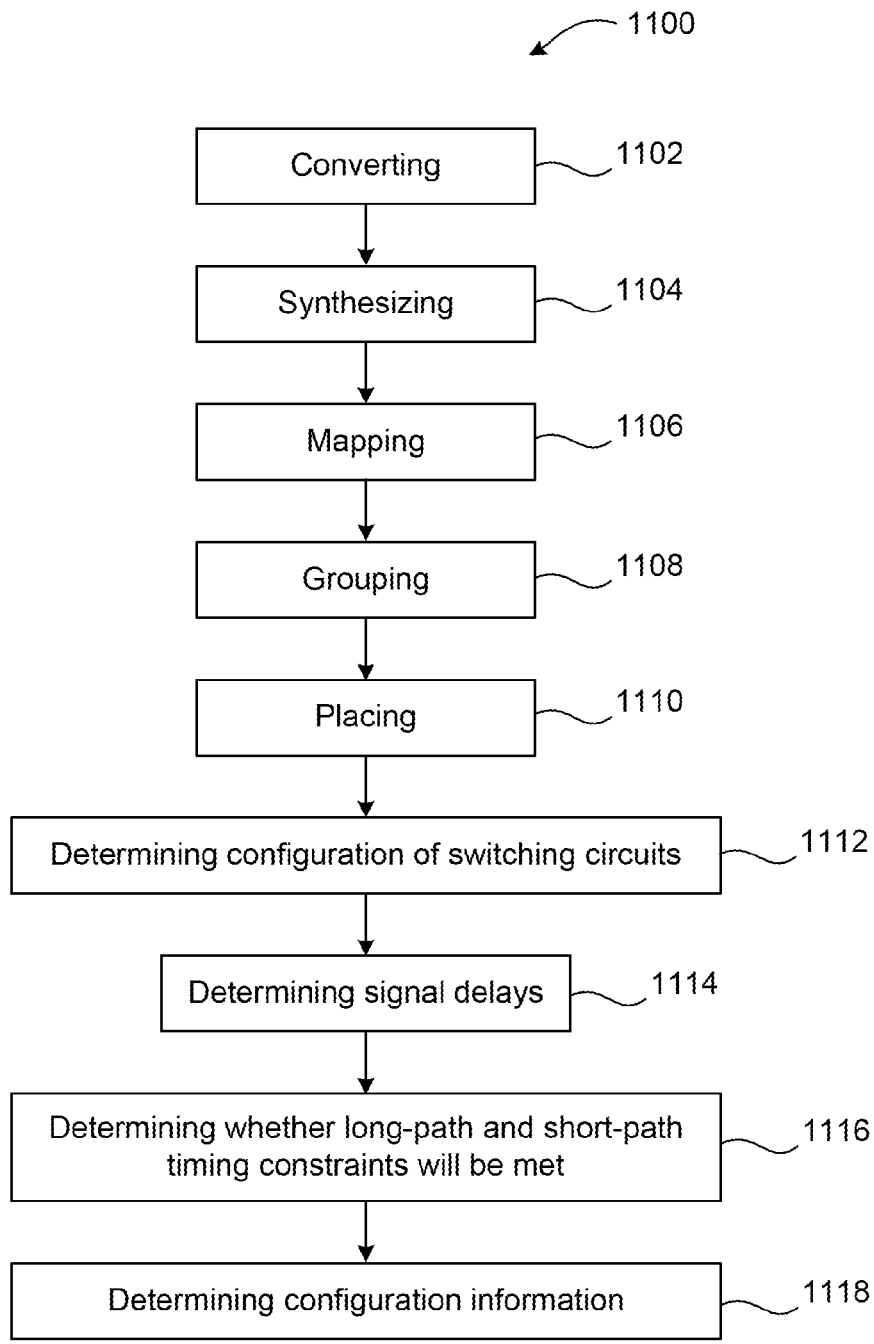
FIG. 11 is an exemplary flow diagram to generate configuration data for initiating a PLD in accordance with one embodiment of the present invention.

With reference to FIG. 11, a compilation method 1100 used to generate configuration data is described. In various embodiments, the compilation method 1100 may be an exemplary computer program executed by processing unit 1002 (FIG. 10) for developing an area-efficient dynamically-configurable memory controller and/or for designing PLD 100 (FIG. 1). Examples of the area-efficient dynamically-configurable memory controller may include hybrid memory controller 400 (FIG. 4), dual memory controller 600 (FIG. 6), and dual memory controller 700 (FIG. 7).

At operation 1102, a user design is converted into a register transfer layer (RTL) design of PLD 100. As an example, the RTL design may include a flow of signals between registers and logical operations that may be performed on the signals. The user design may be expressed in a format, e.g., Hardware Description Language (HDL) or Verilog. At operation 1104, the RTL design is synthesized into a set of logic gates. This set of logic gates may provide a synthesized design of PLD 100. At operation 1106, the set of logic gates is mapped into a set of atoms. An atom is generally referred to irreducible constituents of the user design. The atoms may correspond to groups of logic gates and other components of the user design matching the capabilities of the LEs 202 (FIG. 2) or other functional blocks of PLD 100. The user design may be converted into any number of different sets of atoms, depending upon the underlying hardware of PLD 100 used to implement the user design.

At operation 1108, related atoms may be grouped together to form clusters. At operation 1110, the clusters of atoms are placed on multiple locations on PLD 100. At operation 1112, configuration of the switching circuits of PLD 100 used to couple the atoms implementing the user design is determined. At operation 1114, multiple signal delays, e.g., data delays, for the sets of atoms and their associated connections in the switching circuits are determined by using a timing model of the PLD 100. At operation 1116, it is determined whether the implementation of the user design in PLD 100 will meet multiple long-path and short-path timing constraints. It is appreciated that in one embodiment, the timing constraints may be user specified via input device 1008 (FIG. 10).

At operation 1118, the configuration information is determined. The configuration information may include a configuration of LEs 202 and the switching circuits 106 (FIG. 1) used to couple the LEs 202. At operation 1118, the configuration information is written in to a configuration file capable of being stored in the memory device 1004 (FIG. 10) for access thereof. For example, the configuration file may be accessed by the processing unit 1002 to configure the PLD 100.

It should be understood that, although some embodiments of the above-described architecture, systems and methods are described with respect to PLD 100 (FIG. 1), in various embodiments, the systems and methods may apply to non-programmable devices such as an Application Specific Integrated Circuit (ASIC) or an Application Specific Standard Product (ASSP). The above-described embodiments are not meant to limit the scope of the present disclosure. On the contrary, the disclosure is intended to cover alternatives, modifications, and equivalents as may be included within the spirit and scope of the disclosure.

Although the foregoing systems and methods have been described in detail by way of illustration and example for purposes of clarity and understanding, it will be recognized that the above described systems and methods may be embodied in numerous other variations and embodiments without departing from the spirit or essential characteristics of the systems and methods. Certain changes and modifications may be practiced, and it is understood that the systems and methods are not to be limited by the foregoing details, but rather is to be defined by the scope of the appended claims.

What is claimed is:

1. An integrated circuit comprising a dynamically-reconfigurable memory controller block, wherein:
   the dynamically-reconfigurable memory controller block is reconfigurable, at run time, between: a first memory controller configured to transmit data at a first data rate and a second memory controller configured to transmit data at a second data rate, the first data rate being different from the second data rate,
   the dynamically-reconfigurable memory controller block is reconfigurable in response to dynamic run-time conditions during operation, and
   the dynamically-reconfigurable memory controller block includes a first set of memory controller resources to be used by the first memory controller, a second set of memory controller resources to be used by the second memory controller, and a third set of memory controller resources to be shared by the first and second memory controllers, wherein the third set of memory controller resources includes one or more of a command queue, a first first-in-first-out buffer, an error code checker, bank tracker, a command interface and a control interface.

2. The integrated circuit of claim 1, wherein the set of memory controller resources shared by the first memory controller and the second memory controller is dynamically shared by the first memory controller and the second memory controller at run time.

3. The integrated circuit of claim 1, wherein the integrated circuit is a programmable logic device.

4. An integrated circuit comprising a dynamically-reconfigurable memory controller block, wherein:
   the dynamically-reconfigurable memory controller block is reconfigurable, at run time, between: a first memory controller configured to transmit data using a first data bus width and a second memory controller configured to transmit data using a second data bus width, the first data bus width being different from the second data bus width,
   the dynamically-reconfigurable memory controller block is reconfigurable in response to dynamic run-time conditions during operation, and
   the dynamically-reconfigurable memory controller block includes a first set of memory controller resources to be used by the first memory controller, a second set of memory controller resources to be used by the second memory controller, and a third set of memory controller resources to be shared by the first and second memory controllers, wherein the third set of memory controller resources includes one or more of a command queue, a first first-in-first-out buffer, an error code checker, bank tracker, a command interface and a control interface.

5. The integrated circuit of claim 4, wherein the set of memory controller resources shared by the first memory controller and the second memory controller is dynamically shared by the first memory controller and the second memory controller at run time.

6. The integrated circuit of claim 4, wherein the integrated circuit is a programmable logic device.

7. An integrated circuit comprising a dynamically-reconfigurable memory controller block, wherein:
   the dynamically-reconfigurable memory controller block is reconfigurable, at run time, between: a first memory controller, a second memory controller, and the first memory controller simultaneously with the second memory controller;
   the first memory controller has a first set of characteristics and the second memory controller has a second set of characteristics, the second set of characteristics being different from the first set of characteristics; and
   one or both of the first and second sets of characteristics are determined in response to dynamic run-time conditions during operation, wherein the dynamically-reconfigurable memory controller block includes a first set of memory controller resources to be used by the first memory controller, a second set of memory controller resources to be used by the second memory controller, and a third set of memory controller resources to be shared by the first and second memory controllers, and
   the third set of memory controller resources includes one or more of a command queue, a first first-in-first-out buffer, an error code checker, bank tracker, a command interface and a control interface.

8. The integrated circuit of claim 7, wherein the first and second sets of characteristics include one or both of a data rate and a data bus width.

9. The integrated circuit of claim 8, wherein the first memory controller and the second memory controller are configurable to operate at different data rates.

10. The integrated circuit of claim 7, wherein the set of memory controller resources shared by the first memory controller and the second memory controller is dynamically shared by the first memory controller and the second memory controller at run time.

11. The integrated circuit of claim 7, wherein the integrated circuit is a programmable logic device.

12. A method comprising:
identifying a first set of memory controller resources needed to implement a first memory controller configured to operate at a first data rate;
identifying a second set of memory controller resources needed to implement a second memory controller configured to operate at a second data rate, the first data rate being different from the second data rate;
determining a subset of the memory controller resources in the first and second sets of memory controller resources which can be shared by the first memory controller and the second memory controller during operation;
determining, with a processor, a layout of a memory controller block of an integrated circuit, such that the memory controller block is dynamically reconfigurable, at run time, between: the first memory controller and the second memory controller, wherein:
the memory controller block is reconfigurable in response to dynamic run-time conditions during operation,
the memory controller block includes a first set of memory controller resources to be used by the first memory controller, a second set of memory controller resources to be used by the second memory controller, and a third set of memory controller resources to be shared by the first and second memory controllers, and
the third set of memory controller resources includes one or more of, a command queue, a first first-in-first-out buffer, an error code checker, bank tracker, a command interface and a control interface.

13. A method comprising
identifying a first set of memory controller resources needed to implement a first memory controller configured to operate with a first data bus width;
identifying a second set of memory controller resources needed to implement a second memory controller configured to operate with a second data bus width, the first data bus width being different from the second data bus width;
determining a subset of the memory controller resources in the first and second sets of memory controller resources which can be shared by the first memory controller and the second memory controller during operation;
determining, with a processor, a layout of a memory controller block of an integrated circuit, such that the memory controller block is dynamically reconfigurable, at run time, between: the first memory controller and the second memory controller, wherein:
the memory controller block is reconfigurable in response to dynamic run-time conditions during operation,
the memory controller block includes a first set of memory controller resources to be used by the first memory controller, a second set of memory controller resources to be used by the second memory controller, and a third set of memory controller resources to be shared by the first and second memory controllers, and
the third set of memory controller resources includes one or more of, a command queue, a first first-in-first-out buffer, an error code checker, bank tracker, a command interface and a control interface.

14. A method comprising
identifying a first set of memory controller resources needed to implement a first memory controller configured to operate with a first memory controller characteristic;
identifying a second set of memory controller resources needed to implement a second memory controller configured to operate with a second memory controller characteristic, the first memory controller characteristic being different from the second memory controller characteristic;
determining a subset of the memory controller resources in the first and second sets of memory controller resources which can be shared by the first memory controller and the second memory controller during operation;
determining, with a processor, a layout of a memory controller block of an integrated circuit, such that the memory controller block is dynamically reconfigurable, at run time, between: the first memory controller, the second memory controller, and the first memory controller simultaneously with the second memory controller; wherein:
the memory controller block is reconfigurable in response to dynamic run-time conditions during operation, wherein
the memory controller block includes a first set of memory controller resources to be used by the first memory controller, a second set of memory controller resources to be used by the second memory controller, and a third set of memory controller resources to be shared by the first and second memory controllers; and
the third set of memory controller resources includes one or more of a command queue, a first first-in-first-out buffer, an error code checker, bank tracker, a command interface and a control interface.

15. The method of 14, wherein the first and second sets of characteristics includes one or both of a data rate and a data bus width.

* * * * *